(12) United States Patent
Xiao et al.

(10) Patent No.: US 8,016,453 B2
(45) Date of Patent: Sep. 13, 2011

(54) LED LAMP ASSEMBLY

(75) Inventors: Xin-Jian Xiao, Shenzhen (CN);
Shih-Hsun Wung, Taipei Hsien (TW);
Yong-Dong Chen, Shenzhen (CN);
Jun-Hua Zeng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 366 days.

(21) Appl. No.: 12/422,214

(22) Filed: Apr. 10, 2009

(65) Prior Publication Data
US 2010/0039807 A1    Feb. 18, 2010

(30) Foreign Application Priority Data
Aug. 15, 2008  (CN) .......................... 2008 1 0303854

(51) Int. Cl.
*F21V 7/00* (2006.01)
(52) U.S. Cl. ........................ 362/247; 362/294
(58) Field of Classification Search .................. 362/235, 362/247, 249.02, 294, 296.01
See application file for complete search history.

(56) References Cited

U.S. PATENT DOCUMENTS

| | | | | |
|---|---|---|---|---|
| 2009/0016062 A1* | 1/2009 | Lee et al. | | 362/294 |
| 2009/0196045 A1* | 8/2009 | Shuai et al. | | 362/294 |
| 2009/0296416 A1* | 12/2009 | Luo et al. | | 362/487 |
| 2010/0080004 A1* | 4/2010 | Zhang | | 362/294 |
| 2010/0157592 A1* | 6/2010 | Xiang et al. | | 362/235 |

* cited by examiner

*Primary Examiner* — David V Bruce
(74) *Attorney, Agent, or Firm* — Altis Law Group, Inc.

(57) ABSTRACT

An LED lamp assembly includes a lamp supporter and an LED lamp supported by the lamp supporter. The LED lamp includes a lamp cover defining a first opening, a reflector received in the lamp cover and defining a second opening, a heat sink secured to a top of the lamp cover and a plurality of LED modules attached on the heat sink. The heat sink has a plurality of heat-conducting faces formed on a periphery thereof and the LED modules are attached on the heat-conducting faces to generate a wide illumination. The heat sink defines a through hole. Heat generated by the LED modules is absorbed by the heat-conducting faces and directly dissipated to an exterior through the first opening of the lamp cover. The first and second openings and the through hole of the heat sink are communicated with each other.

17 Claims, 5 Drawing Sheets

LED LAMP ASSEMBLY

BACKGROUND

1. Technical Field

The disclosure relates to an LED (light emitting diode) lamp assembly, more particularly to an LED lamp assembly having a wide illumination and an excellent heat-dissipation structure.

2. Description of Related Art

An LED lamp utilizes light-emitting diodes (LEDs) as a source of illumination. LEDs provide resistance to shock and an almost endless lifetime under specific conditions, making them a cost-effective and high quality replacement for incandescent and fluorescent lamps.

Known implementations of LED modules in an LED lamp make use of a plurality of individual LEDs to generate light. The large number of LEDs, however, increases price and power consumption of the module. Considerable heat is also generated, which, if not adequately addressed at additional expense, impacts LED lamp reliability.

Further, since the LEDs are generally arranged on a printed circuit board having a planar surface, illumination is distributed at a wide variety of spatial angles with marked differences in intensity and brightness, making it unsuitable for environments requiring even and broad illumination.

What is needed, therefore, is an LED lamp which can overcome the limitations described.

BRIEF DESCRIPTION OF THE DRAWINGS

Other advantages and novel features of the disclosure will become more apparent from the following detailed description of an embodiment/embodiments when taken in conjunction with the accompanying drawings.

DETAILED DESCRIPTION

Figure 1:
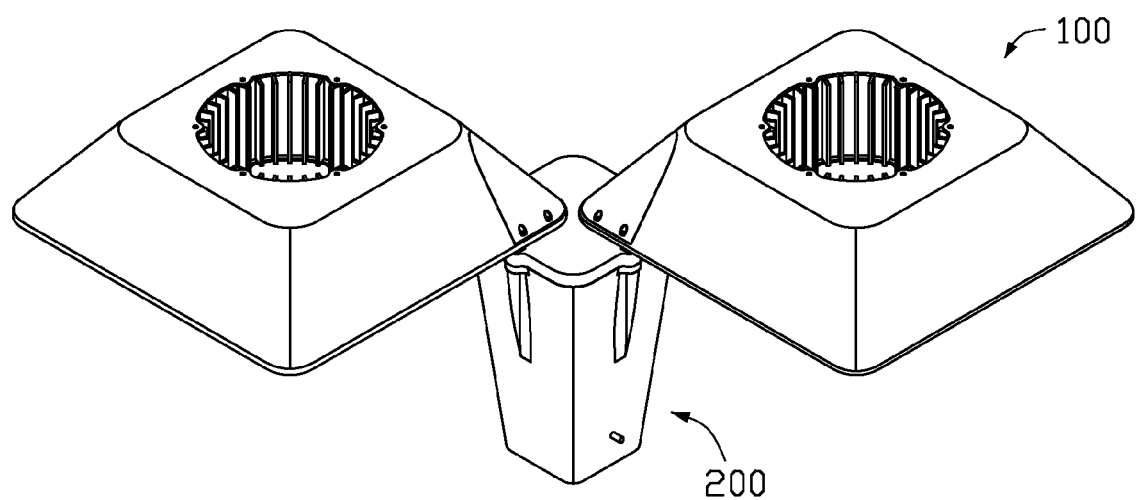
FIG. 1 is an isometric, assembled view of an LED lamp assembly in accordance with an exemplary embodiment of the disclosure.
Figure 2:
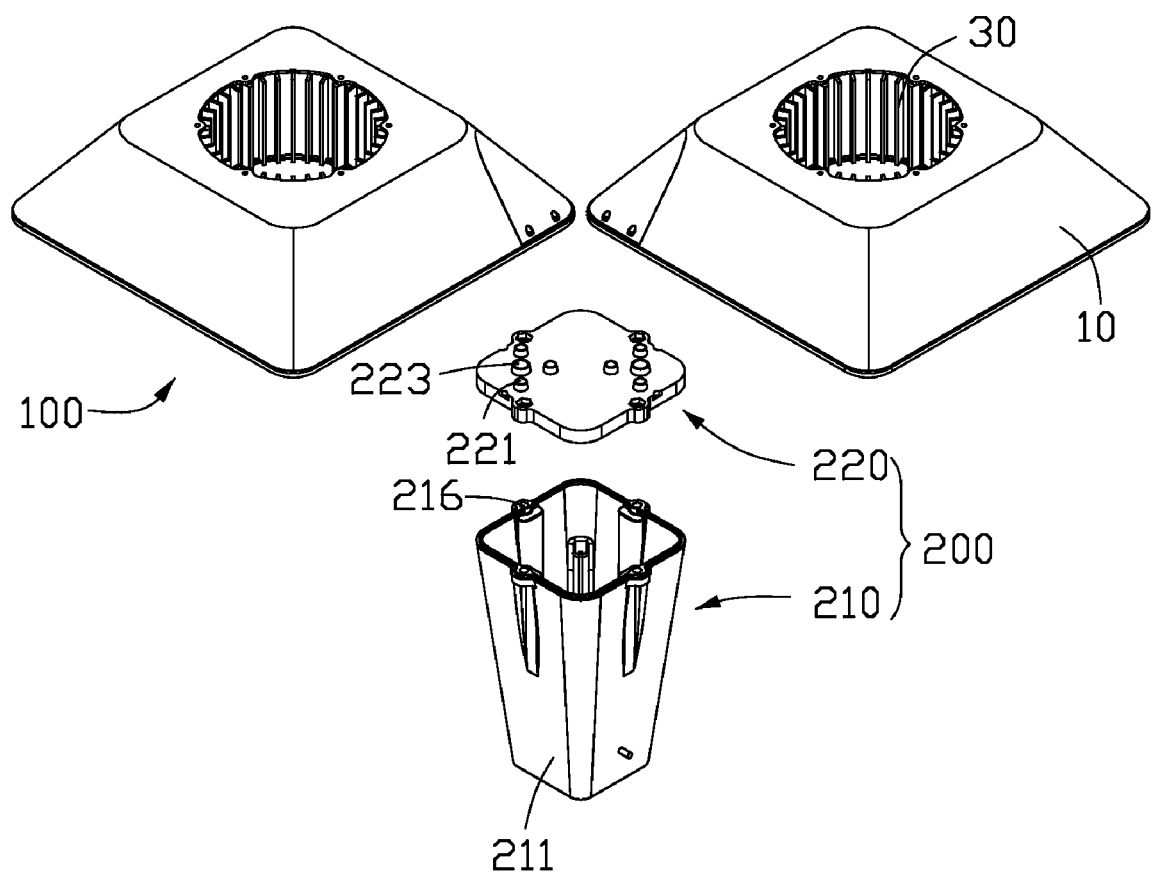
FIG. 2 is an exploded view of the LED lamp assembly of FIG. 1.
Figure 3:
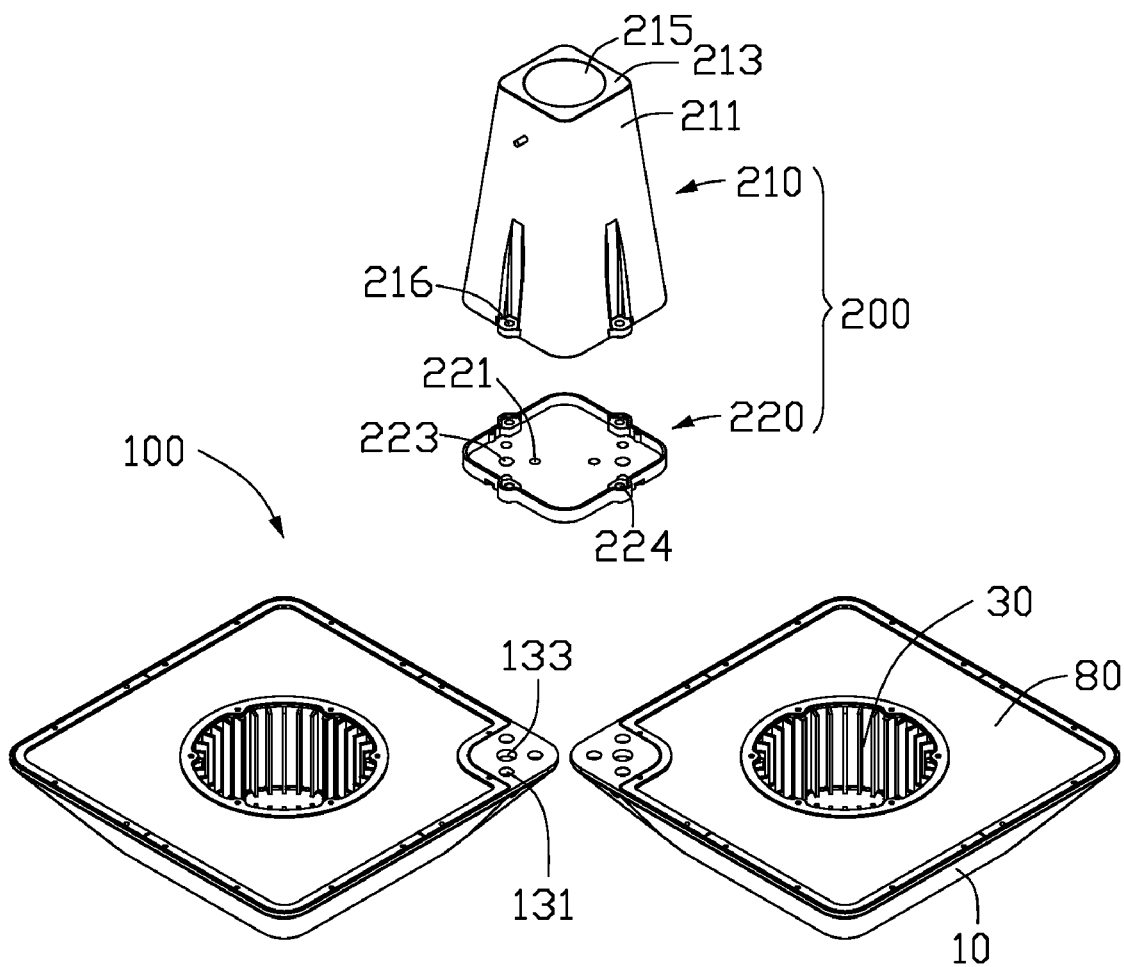
FIG. 3 is an inverted view of FIG. 2.
Figure 4:
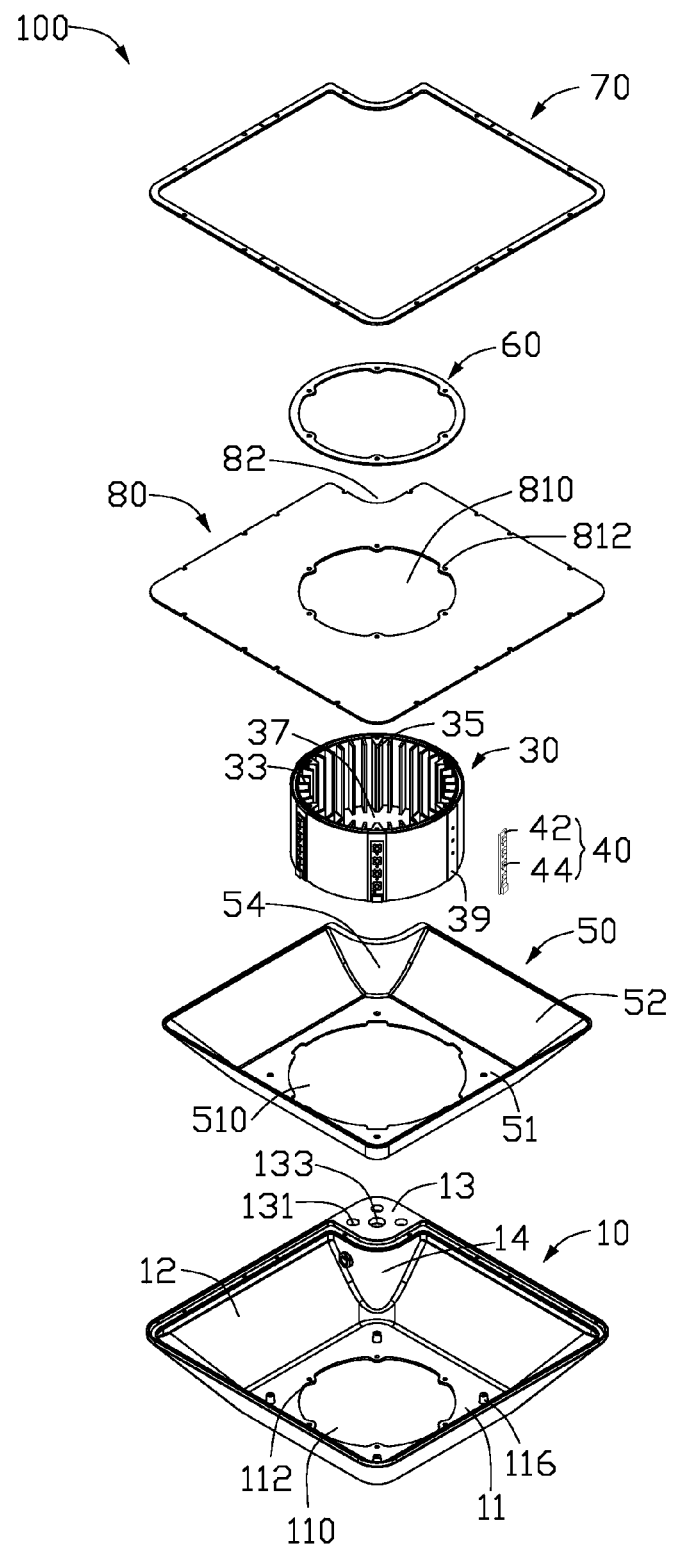
FIG. 4 is an exploded view of an LED lamp of the LED lamp assembly of FIG. 3.
Figure 5:
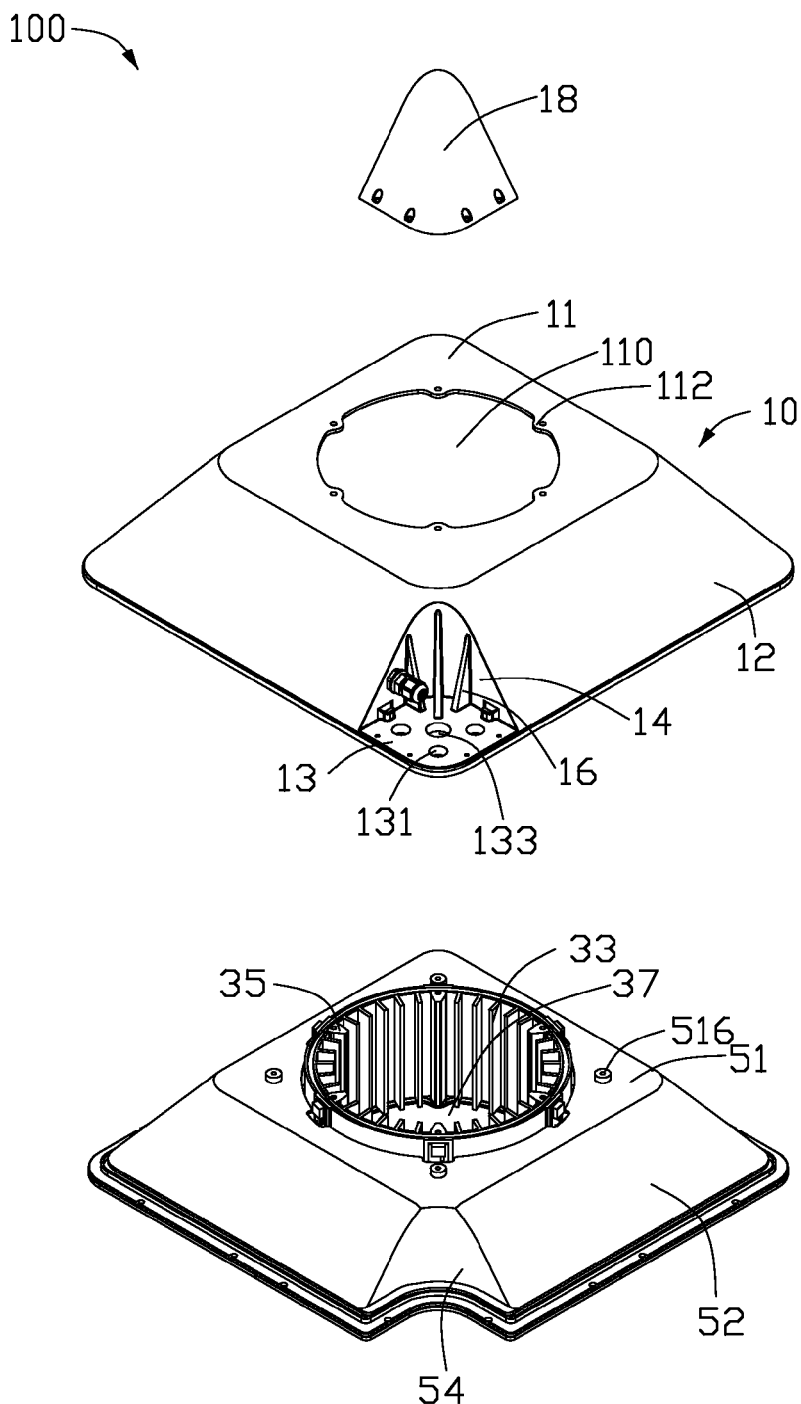
FIG. 5 is a partially assembled view of the LED lamp of FIG. 4, viewed from another aspect.

Referring to FIGS. 1-5, an LED lamp assembly (not labeled) in accordance with an exemplary embodiment is illustrated. The LED lamp assembly is configured for providing illumination outdoors. The LED lamp assembly includes two LED lamps 100 and a lamp supporter 200 supporting the two LED lamps 100 at two opposite sides thereof.

The lamp supporter 200 comprises a hollow cup-shaped main body 210 and a lid 220 mounted on a top of the main body 210. The main body 210 comprises four sidewalls 211 interconnecting each other to define a receiving space, for receiving a top end of a lamp pole (not shown) therein, thereby positioning the LED lamp assembly at a desired position. The main body 210 comprises a bottom panel 213 and the bottom panel 213 defines an engaging hole 215 in a center thereof. A mounting hole 216 is defined in a middle of each side edge of a top of the main body 210. The lid 220 is a rectangular plate which has a size similar to that of an outer periphery of the top of the main body 210. A pair of extending protrusions 223 is diagonally formed on a top surface of the lid 220. Each extending protrusion 222 defines a hole (not labeled) therein, provided for extension of electrical wires (not shown) of the two LED lamps 100 therethrough to extend in the lamp supporter 200 and the lamp pole (not shown) to connect with a power source (not shown). The lid 220 comprises a pair of first fixing portions engaging in the two LED lamps 100 to secure the two LED lamps 100 to the lid 220 of the lamp supporter 200. The first fixing portions each comprise three spaced fixing protrusions 221 formed on the top surface of the lid 220 around one corresponding extending protrusion 223. The fixing protrusions 221 engage in the LED lamps 100 to secure the LED lamps 100 to the lid 220 of the lamp supporter 200. Four through holes 224 are defined in the top surface of the lid 220 and in alignment with the mounting holes 216 of the main body 210, respectively. Fasteners (not shown) are used to extend through the through holes 224 and screw in the mounting holes 216 to mount the lid 220 on the top of the main body 210.

The two LED lamps 100 each have a hollow prism-shaped configuration and comprises a lamp cover 10, a heat sink 30 received in the lamp cover 10, a plurality of LED modules 40 thermally attached to the heat sink 30, a reflector 50 sandwiched between the lamp cover 10 and the heat sink 30 and a lens 80 coupled to a bottom of the lamp cover 10.

The lamp cover 10 has a hollow prism-shaped configuration and comprises a top panel 11 and four sidewalls 12 extending downwardly and outwardly from four side edges of the top panel 11. The top panel 11 defines a first opening 110 in a center thereof. A plurality of equidistantly spaced ears 112 extend inwardly from an inner edge of top panel 11 into the first opening 110 to secure the heat sink 30 thereto. A plurality of mounting studs 116 are formed on an inner surface of the top panel 11 and located at four corners of the top panel 11 of the lamp cover 10. The reflector 50 is secured to the mounting studs 116 of the lamp cover 10. A platform 13 is formed horizontally at a bottom of a corner of the lamp cover 10 and is parallel to the top panel 11. A pair of extending holes 133 are defined in the platforms 13 of the lamp covers 10 and in alignment with the extending protrusions 223, allowing the electrical wires of the two LED lamps 100 to pass therethrough. The lamp cover 10 further comprises a pair of second fixing portions engaging with the first fixing portions of the lid 220 of the lamp supporter 200. The second fixing portions are, for example, two groups of fixing holes 131 defined in the platforms 13 of the lamp covers 10 and in alignment with the fixing protrusions 221 of the lid 220 of the lamp support 200. An arched wall 14 extends upwardly and inwardly from an inner side edge of the platform 13. By the arched wall 14, the sidewalls 12 of the lamp cover 10 has a recessed corner. A plurality of triangle-shaped ribs 16 are integrally formed on a top face of the platform 13 and an outer face of the arched wall 14 to enhance strength of the platform 13. A curved hood 18 is secured to an outer edge of the top face of the platform 13 to cover the top face of platform 13, the outer face of the arched wall 14 and the ribs 16 to give the LED lamp 100 an appearance of integrality. A cavity (not labeled) is defined between the arched wall 14, the platform 13 and the curved hood 18. The electrical wires of the LED lamp 100 extend through the cavity.

The reflector 50 has a prism-shaped configuration similar to that of the lamp cover 10 and is received in the lamp cover 10. The reflector 50 comprises a top panel 51 and four sidewalls 52 extending downwardly and outwardly from four side edges of the top panel 51. The top panel 51 defines a second opening 510 corresponding to the first opening 110 of the lamp cover 10. A plurality of mounting studs 516 are formed on an upper face of the top panel 51, in alignment with the mounting studs 116 of the lamp cover 10. Fasteners (not shown) are used to extend through the mounting studs 516 and screw in the mounting studs 116 to mount the reflector 50 in the lamp cover 10. A curved wall 54 is formed at a corner of the reflector 50 corresponding to the arched wall 14 of the lamp cover 10.

The heat sink 30 is integrally formed of a material with good heat conductivity such as aluminum or copper. The heat sink 30 is a hollow cylinder and comprises a plurality of fins 33 extending radially from an inner circumference of the hollow cylinder. A through hole 37 is defined in a center of the heat sink 30. A plurality of equidistantly spaced connecting ribs 35 are formed on the inner circumference of the hollow cylinder. The spaced connecting ribs 35 are located parallel to a central axis of the heat sink 30 and in alignment with the ears 112 of the lamp cover 10. Fasteners (not shown) are used to extend through the ears 112 and screw in the connecting ribs 35 to mount the heat sink 30 on the top panel 11 of the lamp cover 10. A plurality of heat-conducting faces 39 are formed on an outer circumference of the hollow cylinder of the heat sink 30. The heat-conducting faces 39 are located respectively corresponding to the connecting ribs 35.

Each LED module 40 comprises a rectangular printed circuit board 42 and a plurality of LED components 44 arranged thereon. The LED modules 40 are thermally attached on the heat-conducting faces 39, respectively, and each are of similar size to the corresponding heat-conducting face 39 of the heat sink 30.

The lens 80 is transparent/translucent plastic or glass, guiding light emitted by the LED modules 40 through a bottom of the corresponding LED lamp 100 in this embodiment. The lens 80 has a shape corresponding to a bottom of the reflector 50 and defines a cutout 82 at a corner thereof corresponding to a bottom edge of the curved wall 54 of the reflector 50. The lens 80 defines a third opening 810 in alignment with the through hole 37 of the heat sink 30 and the second opening 510 of the reflector 50. A plurality of equidistantly spaced ears 812 are extended inwardly and horizontally from an inner edge of the lens 80 toward the third opening 810, in alignment with the connecting ribs 35 of the heat sink 30. To enhance waterproofing capability of the LED lamps 100, two gaskets 60, 70 are located on a bottom of the lens 80, with the substantially rectangular gasket 70 sandwiched between an outer edge of the lens 80 and an outer side of a bottom of the lamp cover 10 and the round gasket 60 sandwiched between a bottom of the heat sink 30 and the inner edge of the lens 80. Fasteners (not shown) are used to extend through the lens 80, the gasket 60 and the ears 812 of the lens 80 and screw in the connecting ribs 35 of the heat sink 30 to firmly and hermetically mount the lens 80 on the heat sink 30. Fasteners (not shown) are used to extend through the lens 80, the gasket 70 and screw in the outer side of the bottom of the lamp cover 10 to firmly and hermetically mount the outer edge of the lens 80 to the bottom of the lamp cover 10.

In use, the LED modules 40 attached on the heat-conducting faces 39 of the heat sink 30, facing different aspects of the heat sink 30, can generate light directed to different orientations around the heat sink 30 to thus evenly provide a broad illuminating area. Since the heat sink 30 is exposed outside, heat generated by the LED modules 40 and absorbed by the heat-conducting faces 39 of the heat sink 30 is directly dissipated to an exterior via an airflow flowing through the third opening 810 of the lens 80, the through hole 37 of the heat sink 30 and the first opening 110 of the lamp cover 10.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED (light emitting diode) lamp comprising:
   a lamp cover defining a first opening in a top thereof;
   a reflector received in the lamp cover and secured to the top of the lamp cover, the reflector defining a second opening corresponding to the first opening of the lamp cover;
   a heat sink having a first end secured to the top of the lamp cover, the heat sink comprising a plurality of heat-conducting faces formed on a periphery thereof and defining a through hole corresponding to the second opening of the reflector, the heat sink and the lamp cover sandwiching the reflector therebetween;
   a plurality of LED modules attached on the heat-conducting faces of the heat sink, respectively, and thermally connecting with the heat sink; and
   lens secured to a second end of the heat sink opposite the first end thereof and engaging a bottom of the lamp cover, the lens defining a third opening corresponding to the through hole of the heat sink, whereby the third opening of the lamp cover, the through hole of the heat sink, the second opening of the reflector and the first opening of the lamp cover are communicated with each other.

2. The LED lamp as claimed in claim 1, wherein the lamp cover comprises a first fixing portion located at a corner thereof, adapted for securing the lamp cover to a desired position.

3. The LED lamp as claimed in claim 2, wherein the lamp cover comprises a platform extending from the corner thereof and the first fixing portion comprises a plurality of fixing holes defined in the platform.

4. The LED lamp as claimed in claim 3, wherein the corner of the lamp cover is recessed to exposed an upper face of the platform, the lamp cover comprises a hood covering and engaging the upper face of the platform and the recessed corner of the lamp cover to enable the lamp cover to have an appearance of integrity, a cavity being defined between the hood and the recessed corner of the lamp cover.

5. The LED lamp as claimed in claim 1, wherein the lamp cover comprises a top panel and a plurality of sidewalls extending outwardly and downwardly from a side edge of the top panel, the first opening being defined in the top panel and the reflector being secured to the top panel of the lamp cover.

6. The LED lamp as claimed in claim 5, wherein the lamp cover comprises a plurality of mounting studs formed on the top panel thereof, the mounting studs being provided for securing the reflector to the lamp cover.

7. The LED lamp as claimed in claim 1, wherein the heat sink comprises a hollow cylinder and a plurality of fins extending radially from an inner circumference of the hollow cylinder, the heat-conducting faces being formed on an outer periphery of the hollow cylinder.

8. The LED lamp as claimed in claim 7, wherein the lamp cover comprises a plurality of ears extending from an inner edge thereof into the first opening thereof, the first end of the heat sink being secured connected to the ears of the lamp cover.

9. The LED lamp as claimed in claim 8, wherein the heat sink comprises a plurality of spaced connecting ribs formed on the inner circumference of the hollow cylinder, the lens being secured to the connecting ribs of the heat sink.

10. An LED (light emitting diode) lamp assembly comprising:
- a lamp supporter comprising a first fixing portion;
- an LED lamp supported by the lamp supporter, the LED lamp comprising:
  - a lamp cover defining a first opening in a top thereof and comprising a second fixing portion engaging the first fixing portion of the lamp supporter to secure the lamp cover to the lamp supporter;
  - a reflector received in the lamp cover, the reflector defining a second opening communicating with the first opening of the lamp cover; and
  - a heat sink received in the lamp cover and having a first end secured to the top of the lamp cover, the heat sink comprising a plurality of heat-conducting faces formed on an outer periphery thereof and defining a through hole communicating with the first opening of the lamp cover and the second opening of the reflector, the heat sink and the lamp cover sandwiching the reflector therebetween; and
- a plurality of LED modules attached on the heat-conducting faces of the heat sink, respectively, to provide a wide illuminating and thermally connecting with the heat sink.

11. The LED lamp assembly as claimed in claim 10, wherein the first fixing portion of the lamp supporter comprises a fixing protrusion and the second fixing portion of the lamp cover comprises a fixing hole and wherein the fixing protrusion engages in the fixing hole to secure the lamp cover to the lamp supporter.

12. The LED lamp assembly as claimed in claim 11, further comprising a lens secured to the lamp cover, the lens defining a third opening communicating with the through hole of the heat sink.

13. The LED lamp assembly as claimed in claim 11, wherein the lamp cover comprises a plurality of ears extending from the top thereof around the first opening and the first end of the heat sink is secured to the ears of the lamp cover.

14. The LED lamp assembly as claimed in claim 11, wherein the lamp cover comprises a plurality of mounting studs formed on the top thereof, the reflector engaging the mounting studs to be secured to the lamp cover.

15. The LED lamp assembly as claimed in claim 11, wherein the lamp supporter comprises a hollow main body and a lid mounted on a top of the hollow main body, the fixing protrusion being formed on the lid.

16. The LED lamp assembly as claimed in claim 12, wherein the lens is also secured to a second end of the heat sink.

17. The LED lamp assembly as claimed in claim 16, further comprising a first gasket sandwiched between the lens and the lamp cover and a second gasket sandwiched between the lens and the second end of the heat sink.

* * * * *